(12) United States Patent
Koshita

(10) Patent No.: US 7,075,357 B2
(45) Date of Patent: Jul. 11, 2006

(54) BOOSTING CIRCUIT AND SEMICONDUCTOR DEVICE USING THE SAME

(75) Inventor: Gen Koshita, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 10/813,761

(22) Filed: Mar. 30, 2004

(65) Prior Publication Data
US 2005/0184795 A1 Aug. 25, 2005

(30) Foreign Application Priority Data
Feb. 19, 2004 (JP) .............................. 2004-043614

(51) Int. Cl.
*G05F 3/02* (2006.01)
(52) U.S. Cl. ...................................... 327/536; 327/537
(58) Field of Classification Search ................ 327/536, 327/537
See application file for complete search history.

(56) References Cited

U.S. PATENT DOCUMENTS

| 3,824,447 | A | * | 7/1974 | Kuwabara | ..................... 363/60 |
| 5,095,223 | A | * | 3/1992 | Thomas | ..................... 307/110 |
| 5,397,931 | A | * | 3/1995 | Bayer | ..................... 327/306 |
| 5,604,707 | A | * | 2/1997 | Kuge et al. | .................. 365/226 |
| 5,672,996 | A | * | 9/1997 | Pyeon | ......................... 327/534 |
| 5,801,577 | A | * | 9/1998 | Tailliet | ........................ 327/536 |
| 5,999,040 | A | * | 12/1999 | Do et al. | ..................... 327/536 |
| 6,483,282 | B1 | * | 11/2002 | Bayer | ........................ 323/315 |
| 6,642,775 | B1 | * | 11/2003 | Imamiya | ..................... 327/536 |
| 6,861,894 | B1 | * | 3/2005 | Cernea | ........................ 327/536 |
| 2004/0183586 | A1 | * | 9/2004 | Lee et al. | .................... 327/536 |

FOREIGN PATENT DOCUMENTS

| JP | 7-37396 | 2/1995 |
| JP | 7-264842 | 10/1995 |
| JP | 8-162915 | 6/1996 |
| JP | 10-214496 | 8/1998 |
| JP | 10-304653 | 11/1998 |
| JP | 11-328984 | 11/1999 |
| JP | P3012634 | 12/1999 |
| JP | 2000-331489 | 11/2000 |

\* cited by examiner

*Primary Examiner*—Terry D. Cunningham
(74) *Attorney, Agent, or Firm*—Muirhead & Saturnelli, LLC

(57) ABSTRACT

A boosting circuit includes first to third charge pump circuits and a switching unit. The first to third charge pump circuit which contains first to third capacitive section charged to the first voltage, respectively. The switching unit connects the first charge pump circuit and the second charge pump circuit in series in response to a first switch signal and a control signal such that a second voltage higher than the first voltage is outputted from a first node to a first internal circuit of a semiconductor device. Also, the switching unit connects the first charge pump circuit, the second charge pump circuit and the third charge pump circuit in series in response to a second switch signal and the control signal, such that a third voltage is outputted from a second node to a second internal circuit of the semiconductor device.

14 Claims, 9 Drawing Sheets

BOOSTING CIRCUIT AND SEMICONDUCTOR DEVICE USING THE SAME

BACKGROUND OF THE INVENTION

1. Field of the Invention

The present invention relates to a boosting circuit, and more particularly to a boosting circuit applied to a semiconductor device which requires a voltage higher than a power supply voltage.

2. Description of the Related Art

In an internal circuit of a semiconductor device exemplified as DRAM (Dynamic Random Access Memory), there is a case that a voltage higher than a power supply voltage is needed. In this case, a boosting circuit is used for supplying the voltage higher than the power supply voltage to an internal circuit of the semiconductor device. As the examples that the boosting circuit is needed, there are a case (1) of applying the voltage higher than the power supply voltage to a word line and a case (2) of applying the voltage higher than the power supply voltage to an anti-fuse.

In the case (1) that the boosting circuit is applied to the DRAM, in order to accumulate charge in a memory cell, a high voltage must be applied to the word line. For this reason, the boosting circuit is included in the semiconductor device for supplying a voltage equal to or high than a power supply voltage VDD. The potential of the word line potential in the DRAM is determined by considering the voltage corresponding to the charge accumulated in the memory cell, and the threshold voltage Vt of the cell transistor. For example, in a device designed in accordance with a 0.13 μm design rule, it is approximately set to 4 V. In the case (2), the boosting circuit is used for anti-fuses of the semiconductor device. The anti-fuse is the fuse that can be electrically turned ON/OFF, differently from a fuse that is physically cut away by laser from outside and the like. As such an anti-fuse, a capacitive fuse is exemplified. In the capacitive fuse, in an initial state, a capacitor has electrically opened terminals. In this capacitive fuse, by giving the high electrical field between the terminals, it is possible to break down an insulating film (a capacitive film). Thus, the terminals can be switched to an electrically short-circuited state. For example, if the capacitive fuse is formed in a film thickness equal to that of a capacitive film of a DRAM cell, the potential difference required between the terminals when the capacitive film is broken down is about 7 V.

Although the case (1) and (2) are described, there may be sufficiently the possibility of needing two kinds of higher voltages in the single semiconductor device. In particular, the DRAM must inevitably be provided with the boosting circuit for the word line described in the case (1). The DRAM in the recent years is provided with the boosting circuits for cutting the fuses and the anti-fuses in order to relieve defective cells in many cases. However, conventionally, the boosting circuit is provided for each of the kinds of the higher voltages.

By the way, the lowering of the external power supply voltage VDD is generally advanced in the present semiconductor integrated circuit. Even in case of the DRAM, the power supply voltage is lowered from 3.3 V to 2.5 V, and then to 1.8 V. However, even if the power supply voltage VDD of the DRAM is lowered, the voltage necessary for the word line requires the same high voltage as in the conventional case. For this reason, when the power supply voltage VDD of 1.8 V is tried to be boosted up to the voltage of about 4 V, the boosting circuit is required which can boosts the voltage from the power supply voltage to two times or more of the power supply voltage.

As the boosting circuit for boosting the power supply voltage to two times or more of it, a boosting circuit 100 is conventionally known in which charge pump circuits are connected in series, as shown in FIG. 1. Such a conventional boosting circuit 100 of capacitance series connection type is described in Japanese Laid Open Patent Applications (JP-A-Heisei 11-328984 and JP-A-Heisei 7-264842). The conventional boosting circuit 100 contains a first boosting circuit 110 and a second boosting circuit 120. The first boosting circuit 110 is for applying a voltage higher than the power supply voltage VDD as an output voltage VPP1 to the word line as an internal circuit of the semiconductor device. The second boosting circuit 120 is for applying a voltage higher than the power supply voltage VDD as an output voltage VPP2 to a capacitive fuse as another internal circuit of the semiconductor device.

The first boosting circuit 110 includes an inverting element INV101, a first charge pump circuit, a second charge pump circuit, and switches SW101 and SW102. The first charge pump circuit has a capacitive section C101. The second charge pump circuit has a capacitive section C102. The inverting element INV101 is connected to a first side electrode of the capacitive section C101. One of terminals of the switch SW101 is connected to a second side electrode of the capacitive section C101. A first side electrode of the capacitive section C102 is connected to the other of the terminals of the switch SW101. One of terminals of the switch SW102 is connected to a second side electrode of the capacitive section C102. A node X1 is connected to the other of the terminals of the switch SW102. The word line is connected, as the internal circuit of the semiconductor device, to the node X1. When the switches SW101 and SW102 are turned off, the first side electrode of the capacitive section C101 is grounded in the first charge pump circuit, and the charge corresponding to the power supply VDD is accumulated in the capacitive section C101. In the second charge pump circuit, the first side electrode of the capacitive section C102 is grounded, and the charge corresponding to the power supply VDD is accumulated in the capacitive section C102.

The second boosting circuit 120 includes an inverting element INV102, a third charge pump circuit, a fourth charge pump circuit, a fifth charge pump circuit, and switches SW103 and SW104 and SW105. The third charge pump circuit has a capacitive section C103. The fourth charge pump circuit has a capacitive section C104. The fifth charge pump circuit has a capacitive section C105. The inverting element INV102 is connected to a first side electrode of the capacitive section C103. One of terminals of the switch SW103 is connected to a second side electrode of the capacitive section C103. A first side electrode of the capacitive section C104 is connected to the other of the terminals of the switch SW103. One of terminals of the switch SW104 is connected to a second side electrode of the capacitive section C104. A first side electrode of the capacitive section C105 is connected to the other of the terminals of the switch SW104. One of terminals of the switch SW105 is connected to a second side electrode of the capacitive section C105. A node X2 is connected to the other of the terminals of the switch SW105. One of terminals of the capacitive fuse or the anti-fuse is connected, as the internal circuit of the semiconductor device to the node X2. When the switches SW103, SW104 and SW105 are turned off, the first side electrode of the capacitive section C103 is grounded in the third charge pump circuit, and the charge corresponding to the power supply VDD is accumulated in the capacitive section C103. In the fourth charge pump circuit, the first side electrode of the capacitive section C104 is grounded, and the charge corresponding to the power supply VDD is accumulated in the capacitive section C104. In the fifth charge pump circuit, the first side electrode of the capacitive section C105 is grounded, and the charge corresponding to the power supply VDD is accumulated in the capacitive section C105.

As shown in FIG. 2, the first boosting circuit 110 is controlled such that the switches SW101 and SW102 are turned on at the same time that the output voltage VPP1 is applied to the word line as the internal circuit of the semiconductor device. When the switches SW101 and SW102 are turned on, a voltage (3*VDD) that is a voltage equal to three times of the power supply voltage VDD is applied to the node X1. That is, the voltage (3*VDD) is applied as the output voltage VPP1 to the word line.

As shown in FIG. 3, the second boosting circuit 120 is controlled such that the switches SW103, SW104 and SW105 are turned on at the same time that the output voltage VPP2 is applied to the capacitive fuse as the internal circuit of the semiconductor device. When the switches SW103, SW104 and SW105 are turned on, a voltage (4*VDD) that is a voltage equal to four times the power supply voltage VDD is applied to the node X2. That is, the voltage (4*VDD) is applied as the output voltage VPP2 to the capacitive fuse.

However, in the above conventional boosting circuit, there is a problem in the chip area of the boosting circuit 100 including the first boosting circuit 110 and the second boosting circuit 120. The charge pump circuit for carrying out the boosting operation typically uses an oxide film capacitor. However, the chip area of this capacitor is wide in the entire chip. For example, in a 512M DDR-DRAM designed in accordance with the 0.13 µm design rule, the chip area of the boosting circuit 100 exceeds 1% of the whole.

The boosting circuit 100 requires the first boosting circuit 110 and the second boosting circuit 120, if the different voltages higher than the power supply voltage are generated for circuit portions such as the word line or the capacitive fuse. For this reason, it requires the total of five charge pump circuits of two charge pump circuits in the first boosting circuit 110 and three charge pump circuits in the second boosting circuit 120. In this way, if the first and second boosting circuits 110 and 120 are required, the circuit area of the boosting circuit 100 becomes wide.

In conjunction with the above description, a negative voltage word line decoder is disclosed in Japanese Laid Open Patent application (JP-A-Heisei 7-37396). In this conventional example, each of a plurality of drive circuits is connected to a word line, to drive it to a voltage which is not negative. Each of a plurality of negative charge pumps is connected with the word line to drive it to a negative voltage.

Also, a semiconductor integrated circuit is disclosed in Japanese Laid Open Patent application (JP-A-Heisei 8-162915). In this conventional example, a first capacitive section is connected to an input section. The first capacitive section is connected to a transfer gate which is connected to an output section. An external power source is connected between the transfer gate and the first capacitive section. A second capacitive section has one terminal connected to a gate section of the transfer gate and another terminal connected to the first capacitive section via a controller. A precharge section is connected to the gate section of the transfer gate to supply a voltage of the power source or a voltage of an internal power source to the gate section.

Also, a semiconductor integrated circuit is disclosed in Japanese Laid Open Patent application (JP-A-Heisei 10-214496). In this conventional example, a voltage clamp section clamps an output voltage to a first voltage lower than a single power source voltage by using a reference voltage. A boosting section boosts the clamped voltage to a positive or negative high voltage.

Also, a semiconductor boosting circuit is disclosed in Japanese Laid Open Patent application (JP-A-Heisei 10-304653). In this conventional example, the boosting circuit includes a plurality of pump blocks connected in series to generate a boosted voltage. A clock generator supplies a clock signal to each of the plurality of pump block. An output of at least one of the plurality of pump blocks is connected to a capacitive element via a diode.

Also, a semiconductor device is disclosed in Japanese Laid Open Patent application (JP-p2000-331489A). In this conventional example, a plurality of charge pump circuits are arranged in parallel and their output nodes are connected to a node in common. A clock generator supplies clock signals of different phases to the plurality of charge pump circuits such that they carries out boosting operations in synchronism with the clock signals, respectively. A control circuit controls the clock generator based on the boosted voltage.

Also, a semiconductor boosting circuit is disclosed in Japanese Pant no. 3012634. In this conventional example, in a boosting control section, a boosting section amplifies an output of an oscillation circuit by a logic section of a predetermined number of inverters, boosts an output of the logic section via a first pumping capacitor, supplies the boosted output to a first output transistor for outputting it to a load circuit as a first control voltage. A voltage conversion boosting section amplifies the output of the oscillation circuit by a logic section of a predetermined number of inverters, boosts an output of the logic section via a second pumping capacitor, supplies the boosted output to a second output transistor for outputting as a second control voltage. A voltage conversion circuit converts the output of the oscillation circuit into a drive power source voltage level by using the second control voltage as a drive power source voltage, and supplies the converted output to the first and second output transistors.

SUMMARY OF THE INVENTION

An object of the present invention is to provide a boosting circuit that can generate a voltage higher than a power supply voltage for each of circuit portions.

Another object of the present invention is to provide a boosting circuit that can reduce a circuit area.

In an aspect of the present invention, a boosting circuit includes first to third charge pump circuits and a switching unit. The first to third charge pump circuit which contains first to third capacitive sections charged to the first voltage, respectively. The switching unit connects the first charge pump circuit and the second charge pump circuit in series in response to a first switch signal and a control signal such that a second voltage higher than the first voltage is outputted from a first node to a first internal circuit of a semiconductor device. Also, the switching unit connects the first charge pump circuit, the second charge pump circuit and the third charge pump circuit in series in response to a second switch signal and the control signal, such that a third voltage is outputted from a second node to a second internal circuit of the semiconductor device.

The switching unit may include first to fourth switching sections. The first switching section connects the first charge pump circuit and the second charge pump circuit in response to the control signal, and the second switching section connects the second charge pump circuit and the first node in response to the control signal and the first switch signal. Also, the third switching section connects the second charge pump circuit and the third charge pump circuit in response to the control signal and the second switch signal, and the fourth switching section connects the third charge pump circuit and the second node.

In this case, a power supply may generate the first voltage. The first charge pump circuit may include a first capacitive section whose first and second side electrodes are connected to the first switching section, and a first backward direction current blocking element whose output is connected to the second side electrode of the first capacitive section and whose input is connected to the power supply, such that a backward current from the first capacitive section to the power supply is blocked. The second charge pump circuit may include a second capacitive section whose first side electrode is connected to the first switching section and whose second side electrode is connected to the second switching section and the third switching section; and a second backward direction current blocking element whose output is connected to the second side electrode of the second capacitive section and whose input is connected to the power supply, such that a backward current from the second capacitive section to the power supply is blocked. The third charge pump circuit may include a third capacitive section whose first side electrode is connected to the third switching section and whose second side electrode is connected to the fourth switching section; and a third backward direction current blocking element whose output is connected to the second side electrode of the third capacitive section and whose input is connected to the power supply, such that a backward current from the third capacitive section to the power supply is blocked.

Also, the first switching section may include first and second inverting elements, a first conductive type of a first transistor and a second conductive type of a second transistor. The first control signal is supplied to the first inverting element. The input of the second inverting element is connected to an output of the first inverting element and the output thereof is connected to the first side electrode of the first capacitive section. The first conductive type of a first transistor is connected between the second side electrode of the first capacitive section and the first side electrode of the second capacitive section and which receives the output of the first inverting element. The second conductive type of a second transistor is connected between the first side electrode of the second capacitive section and a ground potential and which receives the output of the first inverting element.

Also, the second switching section may include a second switching section control circuit and the second conductive type of a third transistor. The second switching section control circuit outputs a second control signal in response to the control signal, the first switch signal and a voltage applied to the first node. The second conductive type of a third transistor is connected between the first node and the second side electrode of the second capacitive section.

Also, the third switching section may include a third switching section control circuit and the second conductive type of a fourth transistor. The third switching section control circuit outputs a third control signal based on the control signal, the second switching signal and a voltage of the second node. The second conductive type of a fourth transistor connects the second side electrode of the second capacitive section and the first side electrode of the third capacitive section in response to the third control signal.

Also, the fourth switching section may include a fourth switching section control circuit and the second conductive type of a fifth transistor. The fourth switching section control circuit outputs a fourth control signal based on the control signal, the second switching signal and a voltage of the second node. The second conductive type of a fifth transistor connects the second side electrode of the third capacitive section and the second node in response to the fourth control signal.

Also, the switching unit may further include a fifth switching section which include a fifth switching section control circuit which outputs a fifth control signal based on the control signal and the second switching signal; and the second conductive type of a sixth transistor which connects the first side electrode of the third capacitive section and the ground potential in response to the fifth control signal.

In another aspect of the present invention, a boosting circuit includes N (N is an integer of two or more) charge pump circuits to which a power supply voltage is applied; and a switching unit. The switching unit connects the J (J is an integer satisfying $2 \leq J \leq N$) charge pump circuits among the N charge pump circuits in series in response to a control signal and a first switching signal, to output a voltage equal to (J+1) times the power supply voltage to a first internal circuit of a semiconductor device. Also, the switching unit connects the k (k is an integer satisfying $2 \leq K \leq N$) charge pump circuits among the N charge pump circuits in series in response to the control signal and a second switching signal, to output a voltage equal to (K+1) times the power supply voltage to a second internal circuit of the semiconductor device.

Also, in another aspect of the present invention, a semiconductor device includes a boosting circuit; and first and second internal circuits connected to the boosting circuit via first and second nodes. The boosting circuit includes first to third charge pump circuits and a switching unit. The first to third charge pump circuit contains first to third capacitive section charged to the first voltage, respectively. The switching unit connects the first charge pump circuit and the second charge pump circuit in series in response to a first switch signal and a control signal such that a second voltage higher than the first voltage is outputted from a first node to a first internal circuit of a semiconductor device. Also, the switching unit connects the first charge pump circuit, the second charge pump circuit and the third charge pump circuit in series in response to a second switch signal and the control signal, such that a third voltage is outputted from a second node to a second internal circuit of the semiconductor device.

The switching unit may include first to fourth switching sections. The first switching section connects the first charge pump circuit and the second charge pump circuit in response to the control signal, and the second switching section connects the second charge pump circuit and the first node in response to the control signal and the first switch signal. Also, the third switching section connects the second charge pump circuit and the third charge pump circuit in response to the control signal and the second switch signal, and the fourth switching section connects the third charge pump circuit and the second node.

In this case, a power supply may generate the first voltage. The first charge pump circuit may include a first capacitive section whose first and second side electrodes are connected to the first switching section, and a first backward direction current blocking element whose output is connected to the second side electrode of the first capacitive section and whose input is connected to the power supply, such that a backward current from the first capacitive section to the power supply is blocked. The second charge pump circuit may include a second capacitive section whose first side electrode is connected to the first switching section and whose second side electrode is connected to the second switching section and the third switching section; and a second backward direction current blocking element whose output is connected to the second side electrode of the second capacitive section and whose input is connected to the power supply, such that a backward current from the second capacitive section to the power supply is blocked. The third charge pump circuit may include a third capacitive section whose first side electrode is connected to the third switching section and whose second side electrode is connected to the fourth switching section; and a third backward direction current blocking element whose output is connected to the second side electrode of the third capacitive section and whose input is connected to the power supply, such that a backward current from the third capacitive section to the power supply is blocked.

Also, the first switching section may include first and second inverting elements, a first conductive type of a first transistor and a second conductive type of a second transistor. The first control signal is supplied to the first inverting element. The input of the second inverting element is connected to an output of the first inverting element and the output thereof is connected to the first side electrode of the first capacitive section. The first conductive type of a first transistor is connected between the second side electrode of the first capacitive section and the first side electrode of the second capacitive section and which receives the output of the first inverting element. The second conductive type of a second transistor is connected between the first side electrode of the second capacitive section and a ground potential and which receives the output of the first inverting element.

Also, in another aspect of the present invention, a semiconductor device includes a boosting circuit; and first and second internal circuits connected to the boosting circuit via first and second nodes. The boosting circuit includes N (N is an integer of two or more) charge pump circuits to which a power supply voltage is applied; and a switching unit. The switching unit connects the J (J is an integer satisfying $2 \leq J \leq N$) charge pump circuits among the N charge pump circuits in series in response to a control signal and a first switching signal, to output a voltage equal to (J+1) times the power supply voltage to a first internal circuit of a semiconductor device. Also, the switching unit connects the k (k is an integer satisfying $2 \leq K \leq N$) charge pump circuits among the N charge pump circuits in series in response to the control signal and a second switching signal, to output a voltage equal to (K+1) times the power supply voltage to a second internal circuit of the semiconductor device.

Also, in another aspect of the present invention, a method of boosting a voltage is achieved by charging first and second capacitors to a first voltage in first and second modes; by boosting a potential of the first capacitor to twice of the first voltage in the first and second modes; by connecting the first and second capacitors in series in the first mode to output a second voltage; by charging a third capacitors to the first voltage in the second mode; and by connecting the first to third capacitor in series in the second mode to output a third voltage.

In this case, the method may further include supplying the second voltage to a first internal circuit of a semiconductor device; and supplying the second voltage to a second internal circuit of the semiconductor device.

DESCRIPTION OF THE PREFERRED EMBODIMENTS

Hereinafter, a boosting circuit according to the present invention will be described in detail with reference to the attached drawings.

Figure 1:
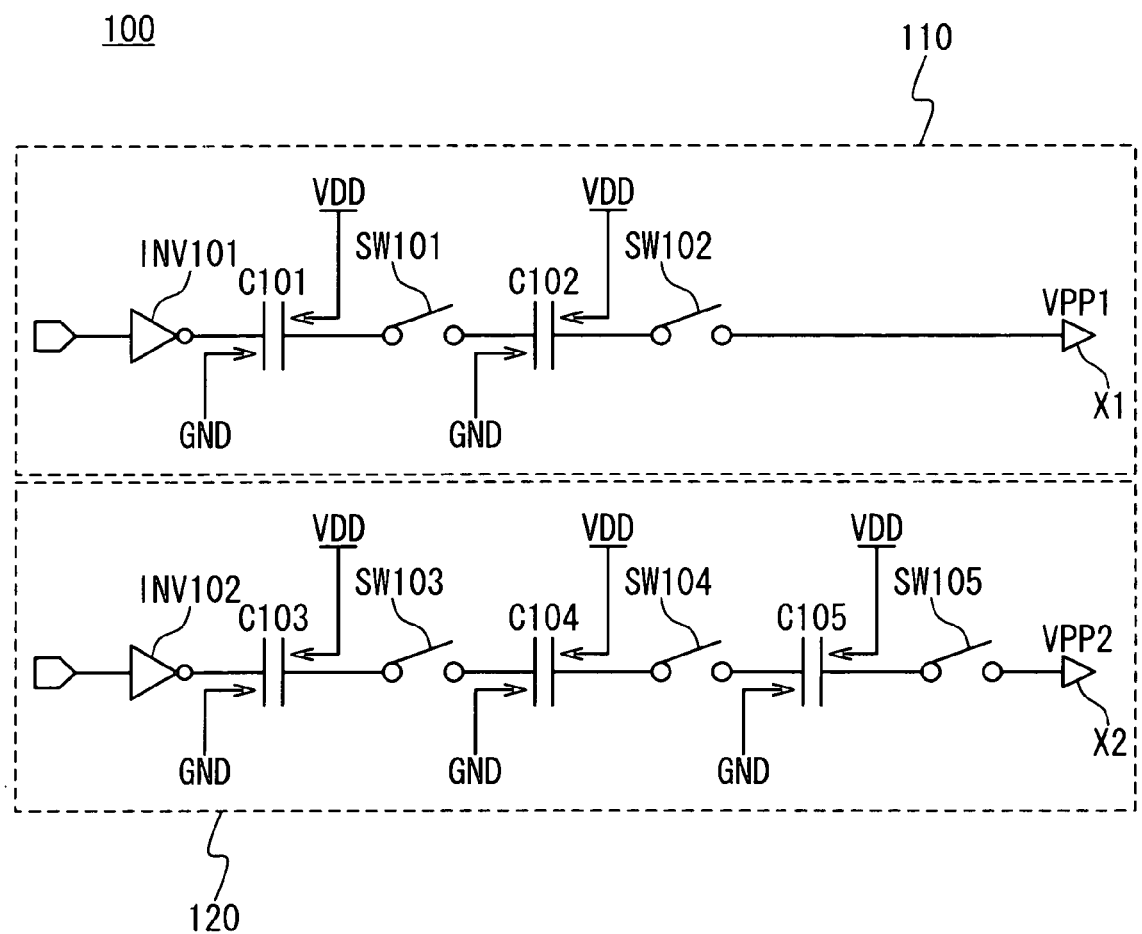
FIG. 1 shows a schematic configuration of a conventional boosting circuit.
Figure 2:
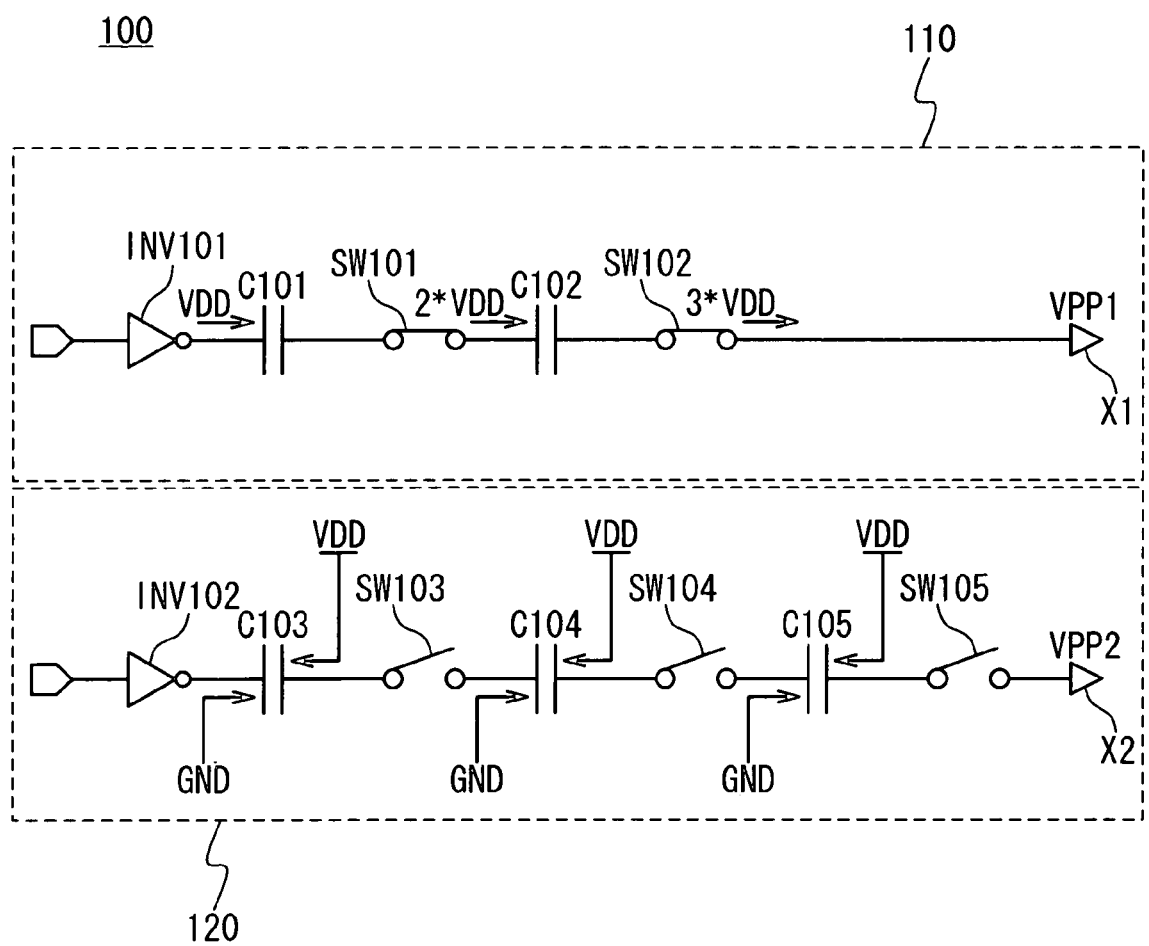
FIG. 2 shows an operation of the conventional boosting circuit.
Figure 3:
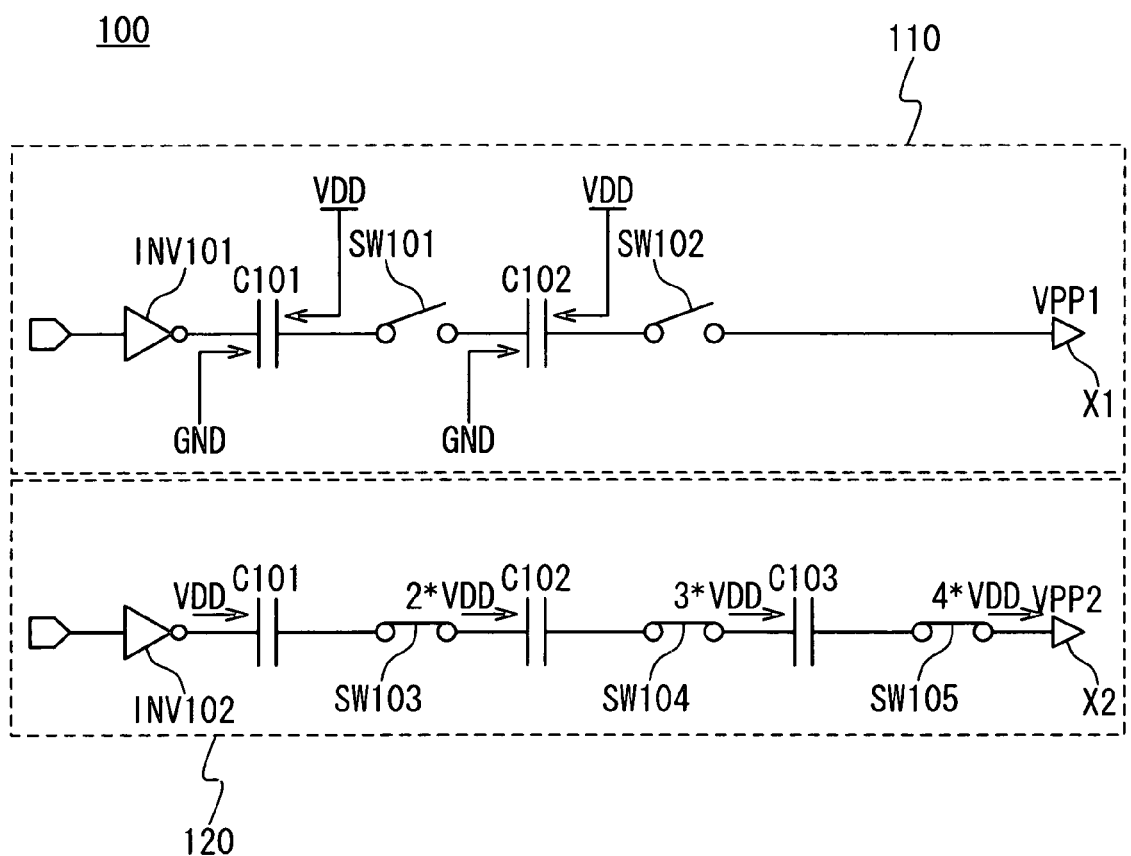
FIG. 3 shows another operation of the conventional boosting circuit.
Figure 4:
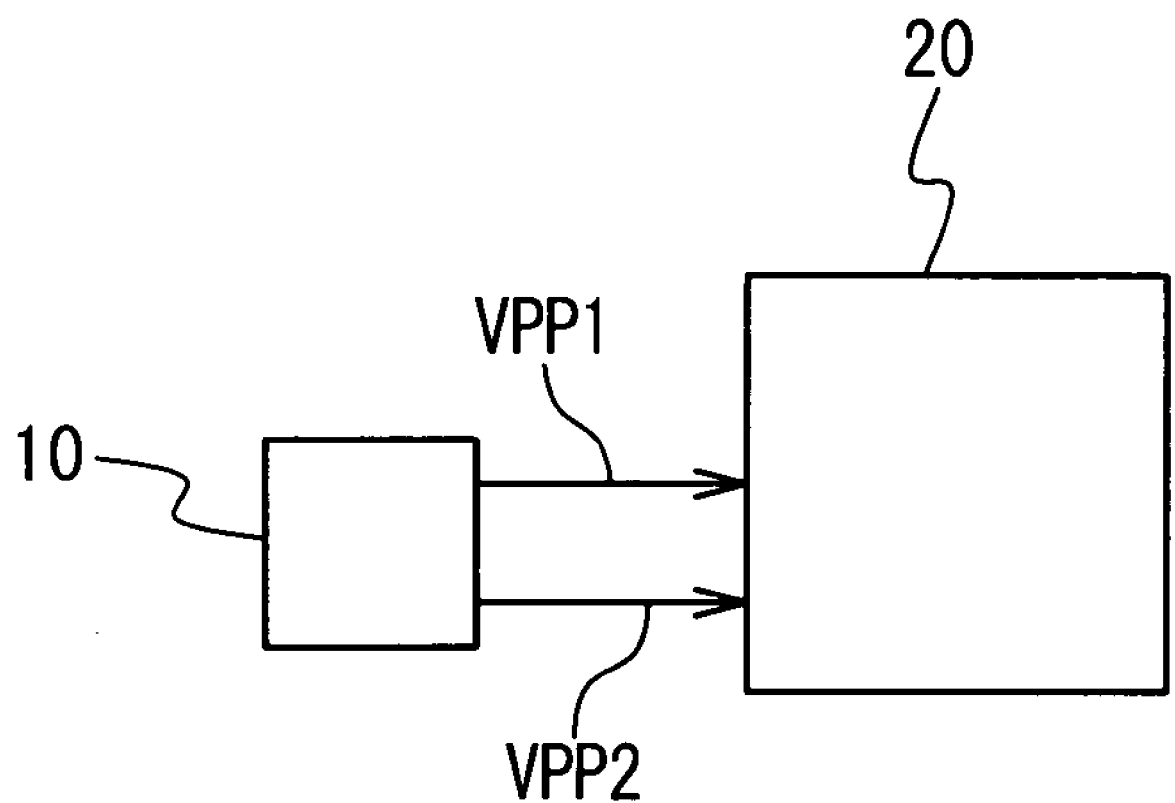
FIG. 4 shows a configuration of a semiconductor device to which a boosting circuit of the present invention is applied.

FIG. 4 shows the configuration of a semiconductor device to which a boosting circuit 10 of the present invention is applied. The boosting circuit 10 is connected to an internal circuit 20 of the semiconductor device. A node X1 and a node X2 (not shown) are provided in the internal circuit 20 of the semiconductor device. A word line is connected to the node X1 as a part of the internal circuit 20 of the semiconductor device, and one of terminals of a capacitive fuse (an anti-fuse) for relieving a defective cell is connected to the node X2 as a part of the internal circuit 20 of the semiconductor device.

Figure 5:
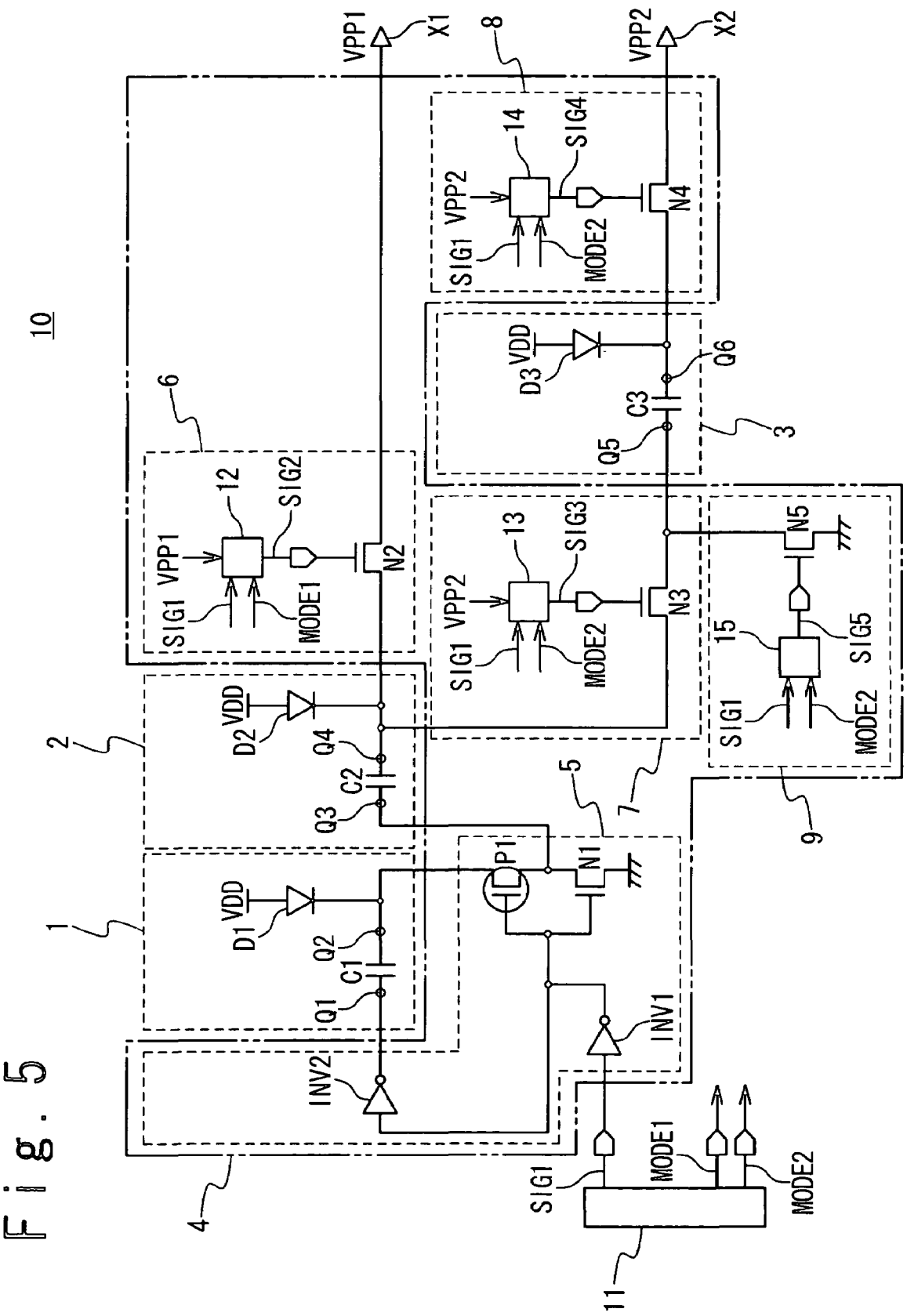
FIG. 5 shows the configuration of the boosting circuit of the present invention.

FIG. 5 shows the configuration of the boosting circuit 10 of the present invention. The boosting circuit 10 includes a charge pump circuit 1, a charge pump circuit 2, a charge pump circuit 3, a switching unit 4 and a controller 11. The charge pump circuit 1 boosts up a first voltage and generates a second voltage which is equal to two times of the first voltage. The charge pump circuit 2 boosts up the second voltage and generates a third voltage which is equal to three times of the first voltage. The charge pump circuit 3 boosts up the third voltage and generates a fourth voltage which is equal to four times of the first voltage.

The controller 11 outputs a control signal SIG1, a switch signal MODE1 or a switch signal MODE2 to the switching unit 4 in accordance with a command supplied from an external unit. The switching units 4, 6 connect the charge pump circuit 1 and the charge pump circuit 2 in series in response to the switch signal MODE1 and the control signal SIG1, and outputs the third voltage as an output voltage VPP1 to the node X1. The switching units 4, 7 connect the charge pump circuit 1, the charge pump circuit 2 and the charge pump circuit 3 in series in response to the switch signal MODE2 and the control signal SIG1 and outputs the fourth voltage as an output voltage VPP2 to the node X2.

In this way, according to the boosting circuit 10 of the present invention, the voltage higher than the power supply voltage VDD as the first voltage can be generated in accordance with use purpose. That is, the boosting circuit 10 of the present invention uses the charge pump circuit 1 and the charge pump circuit 2 when the third voltage or the output voltage VPP1 is to be applied to a word line as a part of the internal circuit 20 of the semiconductor device. The boosting circuit 10 of the present invention uses the charge pump circuit 1, the charge pump circuit 2 and the charge pump circuit 3, when the fourth voltage outputted as the output voltage VPP2 is to be applied to the capacitive fuse as a part of the internal circuit 20 of the semiconductor device.

Also, according to the boosting circuit 10 of the present invention, a circuit area can be reduced. In the conventional boosting circuit 100, the first charge pump circuit and the second charge pump circuit are used when the output voltage VPP1 is applied to the word line, and the third charge pump circuit, the fourth charge pump circuit and the fifth charge pump circuit are used when the output voltage VPP2 is applied to the capacitive fuse. That is, the conventional boosting circuit 100 requires a total of five charge pump circuits. On the contrary, according to the boosting circuit 10 of the present invention, it only requires a total of three charge pump circuits. Thus, the boosting circuit 10 of the present invention only requires the chip area equal to 3/5 times of the conventional boosting circuit 100. Therefore, the circuit area is reduced by about 40%.

The charge pump circuit 1 includes a capacitive section C1 and a diode D1. A node Q1 is connected to a first side electrode of the capacitive section C1, and a node Q2 is connected to a second side electrode of the capacitive section C1. A first switching section 5 is connected to the node Q2. The cathode of the diode D1 is connected to the node Q2 and the anode of the diode D1 is connected to a voltage VDD which is the above-mentioned first voltage.

The charge pump circuit 2 includes a capacitive section C2 and a diode D2. A node Q3 is connected to a first side electrode of the capacitive section C2. The first switching section 5 is connected to the node Q3. A node Q4 is connected to a second side electrode of the capacitive section C2. A second switching section 6 and a third switching section 7 are connected to the node Q4. The node Q4 is connected to a cathode of the diode D2. The voltage VDD is connected to an anode of the diode D2.

The charge pump circuit 3 includes a capacitive section C3 and a diode D3. A node Q5 is connected to a first side electrode of the capacitive section C3. The third switching section 7 is connected to the node Q5. A node Q6 is connected to a second side electrode of the capacitive section C3. A fourth switching section 8 is connected to the node Q6. The node Q6 is connected to a cathode of the diode D3. The voltage VDD is connected to an anode of the diode D3.

The diodes D1, D2 and D3 are exemplified as elements to prevent current from flowing from the capacitive section to the voltage VDD. However, the elements may be composed of transistors.

The controller 11 outputs a control signal SIG1, switch signals MODE1 and MODE2 in accordance with a command supplied from an external unit.

The switching unit 4 has the first switching section 5, the second switching section 6, the third switching section 7 and the fourth switching section 8. The first switching section 5 connects the charge pump circuit 1 and the charge pump circuit 2 in response to the control signal SIG1. The second switching section 6 connects the charge pump circuit 2 and the node X1 in response to the control signal SIG1 and the switch signal MODE1. The third switching section 7 connects the charge pump circuit 2 and the charge pump circuit 3 in response to the control signal SIG1 and the switch signal MODE2. The fourth switching section 8 connects the charge pump circuit 3 and the node X2 in response to the control signal SIG1 and the switch signal MODE2.

The first switching section 5 has an inverting element INV1, an inverting element INV2, a P-type transistor P1 and an N-type transistor N1. The controller 11 is connected to an input terminal of the inverting element INV1, and supplies the control signal SIG1 to it. An output terminal of the inverting element INV1 is connected to an input terminal of the inverting element INV2. The node Q1 is connected to an output terminal of the inverting element INV2. The output terminal of the inverting element INV1 is connected to a gate of the transistor P1 and a gate of the transistor N1. Thus, the transistor P1 and the transistor N1 function as an inverting element. The node Q2 is connected to a source of the transistor P1. The node Q3 is connected to a drain of the transistor P1 and a drain of the transistor N1 as an output of the inverting element of the transistors P1 and N1. A source of the transistor N1 is grounded.

If the control signal SIG1 of a high voltage level which may be equal to the voltage VDD is applied to the gate of the transistor P1, the transistor P1 is turned off. If the control signal SIG1 of a low voltage level which may be equal to the ground level is applied to the gate of the transistor P1, the transistor P1 is turned on. If the control signal SIG1 of the high voltage level is applied to the gate of the transistor N1, the transistor N1 is turned on. If the control signal SIG1 of the low voltage level is applied to the gate of the transistor N1, the transistor N1 is turned off.

The second switching section 6 has a second switching section control circuit 12 and an N-type transistor N2. The second switching section control circuit 12 is connected to a gate of the transistor N2. The second switching section control circuit 12 outputs a control signal SIG2 in accordance with the control signal SIG1, the switch signal MODE1 and a voltage VPP1 applied to the node X1. The node Q4 is connected to a drain of the transistor N2, and the node X1 is connected to a source of the transistor N2. The control signal SIG2 takes the same voltage level as the voltage VDD or a voltage level (VPP1+VDD) obtained by adding the voltage VPP1 applied to the node X1 to the voltage VDD. When the control signal SIG2 takes the same voltage level as the voltage VDD, the transistor N2 is turned off, and when the control signal SIG2 takes the voltage level (VPP1+VDD), the transistor N2 is turned on.

The third switching section 7 has a third switching section control circuit 13 and an N-type transistor N3. The third switching section control circuit 13 is connected to a gate of the transistor N3. The third switching section control circuit 13 outputs a control signal SIG3 in accordance with the control signal SIG1, the switch signal MODE2 and the voltage VPP2 applied to the node X2. The node Q4 is connected to a drain of the transistor N3, and the node Q5 is connected to a source of the transistor N3. The control signal SIG3 has the ground level GND or the voltage level VPP2 applied to the node X2. When the control signal SIG3 takes the ground level, the transistor N3 is turned off, and when the control signal SIG3 takes the voltage level VPP2, the transistor N3 is turned on.

The fourth switching section 8 has a fourth switching section control circuit 14 and an N-type transistor N4. The fourth switching section control circuit 14 is connected to a gate of the transistor N4. The fourth switching section control circuit 14 outputs a control signal SIG4 in accordance with the control signal SIG1, the switch signal MODE2 and the voltage VPP2 applied to the node X2. The node Q6 is connected to a drain of the transistor N4, and the node X2 is connected to a source of the transistor N4. The control signal SIG4 takes the same voltage level as the voltage level VDD or a voltage level (VPP2+VDD) obtained by adding the voltage VPP2 applied to the node X2 to the voltage level VDD. When the control signal SIG4 takes the voltage level VDD, the transistor N4 is turned off, and when the control signal SIG4 takes the voltage level (VPP2+VDD), the transistor N4 is turned on.

The switching unit 4 further has a fifth switching section 9. The fifth switching section 9 has a fifth switching section control circuit 15 and an N-type transistor N5. The fifth switching section control circuit 15 is connected to a gate of the transistor N5. The fifth switching section control circuit 15 outputs a control signal SIG5 in accordance with the control signal SIG1 and the switch signal MODE2. The node Q5 is connected to a drain of the transistor N5, and a source of the transistor N5 is grounded.

Figure 6:
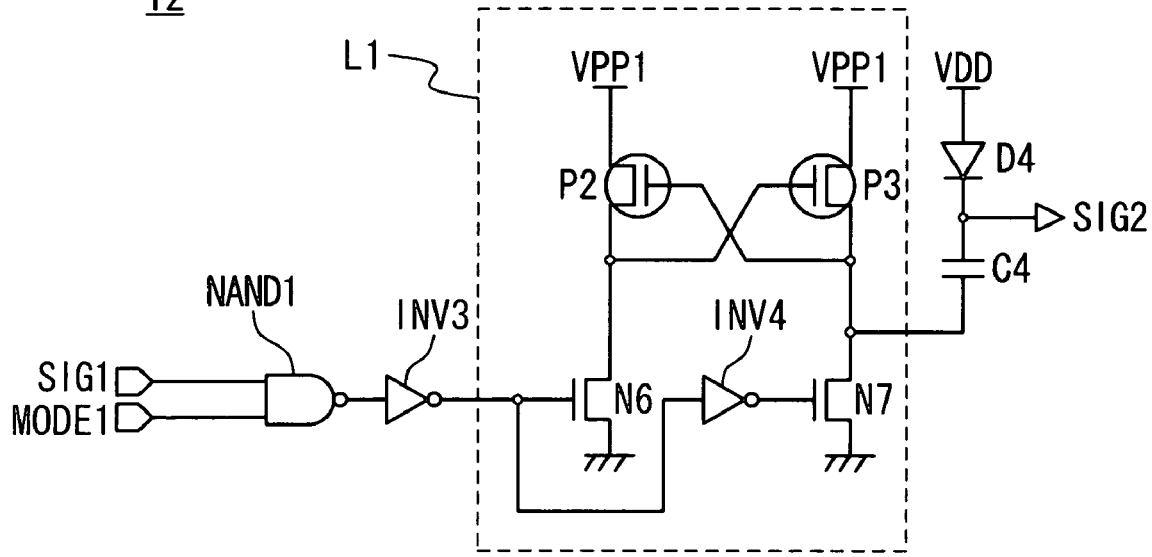
FIG. 6 shows the configuration of a second switch section control circuit of the boosting circuit of the present invention.

FIG. 6 shows the configuration of the second switching section control circuit 12 of the boosting circuit 10 of the present invention. The second switching section control circuit 12 has a logical circuit NAND1, an inverting element INV3, a circuit L1, a capacitive section C4 and a diode D4. The controller 11 is connected to an input terminal of a NAND circuit NAND1 to supply the control signal SIG1 and the switch signal MODE1. An output terminal of the NAND circuit NAND1 is connected to an input terminal of the inverting element INV3. The circuit L1 is connected to an output terminal of the inverting element INV3. The circuit L1 is connected to a first side electrode of the capacitive section C4. The gate of the transistor N2 is connected to a second side electrode of the capacitive section C4. The voltage VDD is connected to an anode of the diode D4. The diode D4 is exemplified as a backward direction current blocking element. However, the backward direction current blocking element may be composed of a transistor.

The circuit L1 has an N-type transistor N6, an inverting element INV4, an N-type transistor N7, a P-type transistor P2 and a P-type transistor P3. An output terminal of the inverting element INV3 is connected to a gate of the N-type transistor N6. A source of the transistor N6 is grounded. The output terminal of the inverting element INV3 is connected to an input terminal of the inverting element INV4. An output terminal of the inverting element INV4 is connected to a gate of the transistor N7. A source of the transistor N7 is grounded. A first side electrode of the capacitive section C4 is connected to a drain of the transistor N7. The node X1 is connected to a source of the transistor P2, to apply the output voltage VPP1. The drain of the transistor N7 is connected to a gate of the transistor P2. The drain of the transistor N6 is connected to a drain of the transistor P2. The node X1 is connected to a source of the transistor P3, to apply the output voltage VPP1. The drain of the transistor N6 is connected to a gate of the transistor P3. The drain of the transistor N7 is connected to a drain of the transistor P3.

Figure 7:
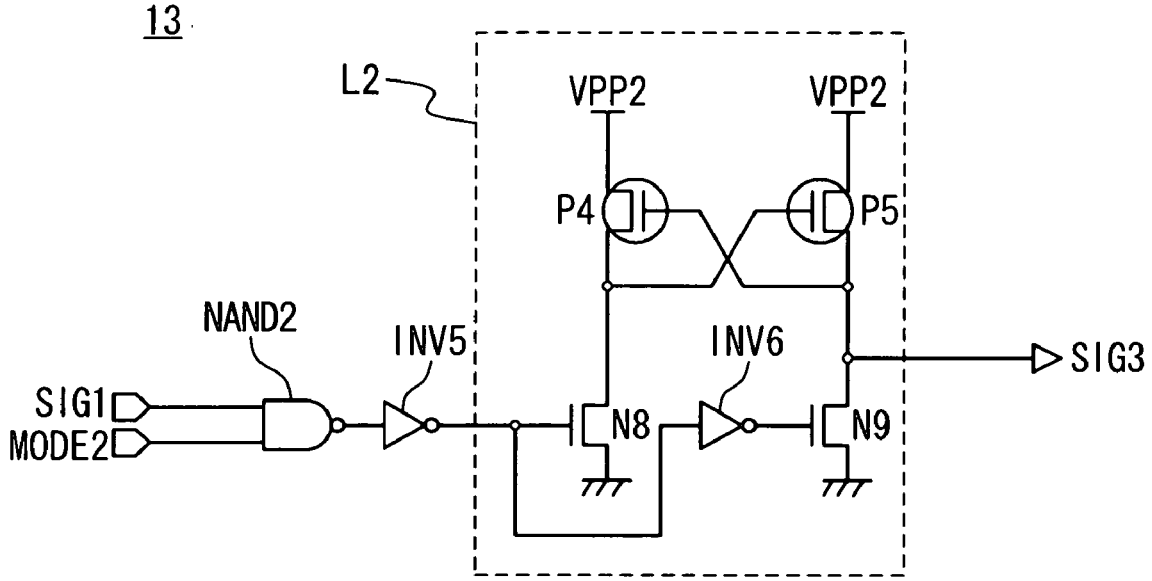
FIG. 7 shows the configuration of a third switch section control circuit of the boosting circuit of the present invention.

FIG. 7 shows the configuration of the third switching section control circuit 13 of the boosting circuit 10 of the present invention. The third switching section control circuit 13 has a logical circuit NAND2, an inverting element INV5 and a circuit L2. The controller 11 is connected to an input terminal of the logical circuit NAND2, and the control signal SIG1 and the switch signal MODE2 are inputted. An output terminal of the logical circuit NAND2 is connected to an input terminal of the inverting element INV5. The circuit L2 is connected to an output terminal of the inverting element INV5.

The circuit L2 has an N-type transistor N8, an inverting element INV6, an N-type transistor N9, a P-type transistor P4 and a P-type transistor P5. An output terminal of the inverting element INV5 is connected to a gate of the N-type transistor N8. A source of the transistor N8 is grounded. The output terminal of the inverting element INV5 is connected to an input terminal of the inverting element INV6. An output terminal of the inverting element INV4 is connected to a gate of the transistor N9. A source of the transistor N9 is grounded. The gate of the transistor N3 is connected to a drain of the transistor N9. The node X2 is connected to a source of the transistor P4, and the output voltage VPP2 is applied. The drain of the transistor N9 is connected to a gate of the transistor P4. The drain of the transistor N8 is connected to a drain of the transistor P4. The node X2 is connected to a source of the transistor P5, and the output voltage VPP2 is applied. The drain of the transistor N8 is connected to a gate of the transistor P5. The drain of the transistor N9 is connected to a drain of the transistor P5.

Figure 8:
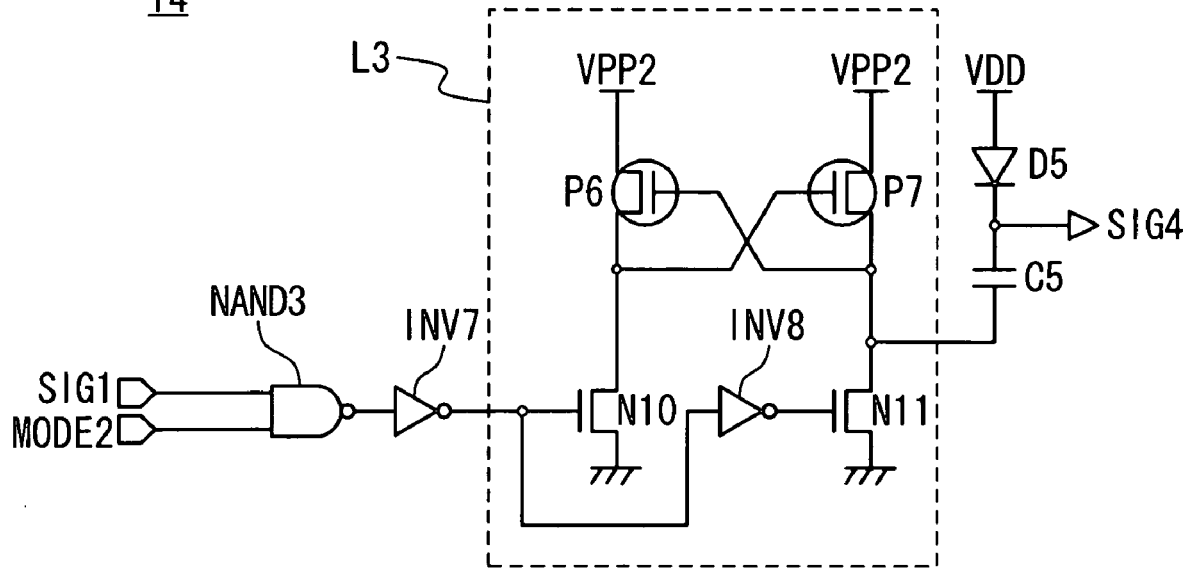
FIG. 8 shows the configuration of a fourth switch section control circuit of the boosting circuit of the present invention.

FIG. 8 shows the configuration of the fourth switching section control circuit 14 of the boosting circuit 10 of the present invention. The fourth switching section control circuit 14 has a logical circuit NAND3, an inverting element INV7, a circuit L3, a capacitive section C5 and a diode D5. The controller 11 is connected to an input terminal of the logical circuit NAND3, and the control signal SIG1 and the switch signal MODE2 are inputted. An output terminal of the logical circuit NAND3 is connected to an input terminal of the inverting element INV7. The circuit L3 is connected to an output terminal of the inverting element INV7. The circuit L3 is connected to a first side electrode of the capacitive section C5. The gate of the transistor N4 is connected to a second side electrode of the capacitive section C5. The power supply VDD is connected to an anode of the diode D5. The diode D5 is the backward direction current blocking element for protecting the back flow to the power supply VDD from the capacitive section C5. The diode D5 is exemplified as the backward direction current blocking element. However, the backward direction current blocking element may be composed of transistors.

The circuit L3 has an N-type transistor N10, an inverting element INV8, an N-type transistor N11, a P-type transistor P6 and a P-type transistor P7. An output terminal of the inverting element INV7 is connected to a gate of the N-type transistor N10. A source of the transistor N10 is grounded. The output terminal of the inverting element INV7 is connected to an input terminal of the inverting element INV8. An output terminal of the inverting element INV8 is connected to a gate of the transistor N11. A source of the transistor N11 is grounded. A first side electrode of the capacitive section C5 is connected to a drain of the transistor N11. The node X2 is connected to a source of the transistor P6, and the output voltage VPP2 is applied. The drain of the transistor N11 is connected to a gate of the transistor P6. The drain of the transistor N10 is connected to a drain of the transistor P6. The node X2 is connected to a source of the transistor P7, and the output voltage VPP2 is applied. The drain of the transistor N10 is connected to a gate of the transistor P7. The drain of the transistor N11 is connected to a drain of the transistor P7.

Figure 9:
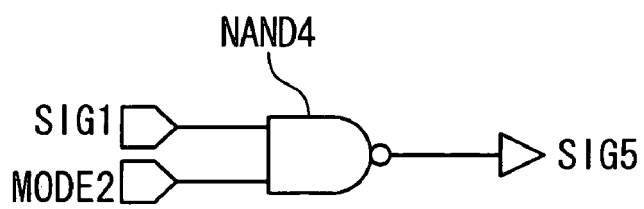
FIG. 9 shows the configuration of a fifth switch section control circuit of the boosting circuit of the present invention.

FIG. 9 shows the configuration of the fifth switching section control circuit 15 of the boosting circuit 10 of the present invention. The fifth switching section control circuit 15 has a logical circuit NAND4. The controller 11 is connected to an input terminal of the logical circuit NAND4, and the control signal SIG1 and the switch signal MODE2 are inputted. The gate of the transistor N5 is connected to an output terminal of the logical circuit NAND4.

The operation of the boosting circuit 10 of the present invention will be described below. The boosting circuit 10 has two operation modes, i.e., a first mode and a second mode. In the first mode, the boosting circuit 10 connects the charge pump circuit 1 and the charge pump circuit 2 in series and outputs the output voltage VPP1 to the node X1. In the second mode, the boosting circuit 10 connects the charge pump circuit 1, the charge pump circuit 2 and the charge pump circuit 3 in series and outputs the output voltage VPP2 to the node X2.

Figure 10:
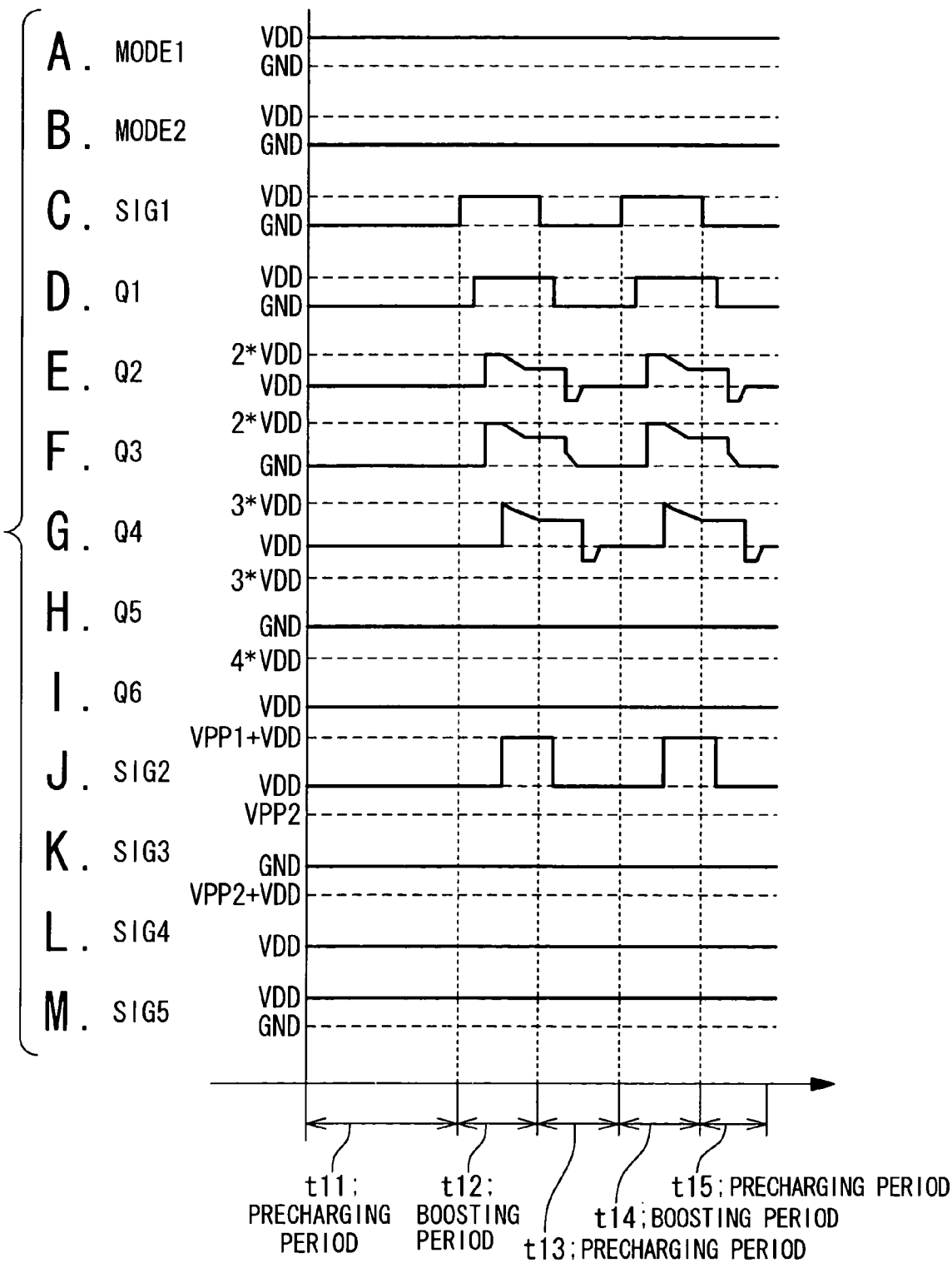
FIGS. 10A to 10M are timing charts showing an operation of the boosting circuit of the present invention in a first mode.

At first, an operation in the first mode will be described. FIGS. 10A to 10M are timing charts showing the operation of the boosting circuit 10 of the present invention in the first mode. In the first mode, a precharging period and a boosting period are alternately executed. In the first mode, the controller 11 outputs the switch signal MODE1 of the high level and the switching signal MODE2 of the low level to the switching unit 4 in accordance with the command supplied from the external unit, as shown in FIGS. 10A and 10B. Also, the controller 11 outputs the control signal SIG1 of the low level during the precharging period and the high level during the boosting period to the switching unit 4 in accordance with the command supplied from the external unit, as shown in FIG. 10C.

During the precharging period t11, in the first charge pump circuit 1, since the controller 11 outputs the control signal SIG1 of the ground level, the voltage of the node Q1 is set to the ground voltage. As a result, the capacitive section C1 is charged to the voltage VDD through the diode D1. Thus, the voltage of the node Q2 rises to the voltage VDD, as shown in FIGS. 10D and 10E. Similarly, in the first charge pump circuit 1 during the precharging period t11, the output of the inverter P1 and N1 is set to the ground level, and the voltage of the node Q3 is set to the ground voltage. As a result, the capacitive section C2 is charged to the voltage VDD through the diode D2. Thus, the voltage of the node Q4 rises to the voltage VDD, as shown in FIGS. 10F and 10G. In the second switching section 6, since the control signal SIG1 is in the ground level and the switching signal MODE1 is in a VDD level, the transistor N6 is turned off and the transistor N7 is turned on. As a result, the capacitor C4 is charged to the voltage VDD through the diode D4 and the control signal SIG2 of the VDD level is outputted to the transistor N2, as shown in FIG. 10J. However, because the node X1 is in a voltage near to the voltage VPP1, the transistor N2 is not turned on. In the third switching section 7, since the control signal SIG1 is in the ground level and the switching signal MODE2 is also in the ground level, the transistor N8 is turned off and the transistor N9 is turned on. As a result, the control signal SIG3 of the ground level is outputted to the transistor N3, as shown in FIG. 10K. Therefore, the transistor N3 is turned off. In the fourth switching section 8, since the control signal SIG1 is in the ground level and the switching signal MODE2 is also in the ground level, the transistor N10 is turned off and the transistor N11 is turned on. As a result, the control signal SIG4 of the ground level is outputted to the transistor N4, FIG. 10L. Therefore, the transistor N4 is turned off. In the fifth switching section 9, since the control signal SIG1 is in the ground level and the switching signal MODE2 is also in the ground level, the control signal SIG5 of the VDD level is outputted to the transistor N5, as shown in FIG. 10M. Therefore, the transistor N4 is turned on. Thus, the capacitor C3 is charged to the voltage VDD.

Subsequently, during the boosting period t12, in the first charge pump circuit 1, since the controller 11 outputs the control signal SIG1 of the VDD level, the voltage of the node Q1 is set to the VDD voltage. As a result, the voltage of the node Q2 rises to the voltage 2VDD, as shown in FIGS. 10D and 10E. Similarly, in the first charge pump circuit 1 during the boosting period t12, the transistor P1 of the inverter P1 and N1 is turned on, and the voltage of the node Q3 is set to equal to the voltage of the node Q2. As a result, the voltage of the node Q4 rises to the voltage 3VDD, as shown in FIGS. 10F and 10G. In the second switching section 6, since the control signal SIG1 is in the VDD level and the switching signal MODE1 is in the VDD level, the transistor N6 is turned on and the transistor N7 is turned off. As a result, the transistor P3 is turned on and the voltage of the drain of the transistor N7 rises to voltage VPP1. Therefore, the control signal SIG2 of the (VDD+VPP1) level is outputted to the transistor N2, as shown in FIG. 10J. As a result, the transistor N2 is turned on and the voltage 3VDD is applied from the capacitor C2 to the node X1. In the third switching section 7, since the control signal SIG1 is in the VDD level and the switching signal MODE2 is in the ground level, the transistor N8 is turned off and the transistor N9 is turned on. As a result, the control signal SIG3 of the ground level is outputted to the transistor N3, as shown in FIG. 10K. Therefore, the transistor N3 is turned off. In the fourth switching section 8, since the control signal SIG1 is in the VDD level and the switching signal MODE2 is in the ground level, the transistor N10 is turned off and the transistor N11 is turned on. As a result, the control signal SIG4 of the ground level is outputted to the transistor N4, FIG. 10L. Therefore, the transistor N4 is turned off. In the fifth switching section 9, since the control signal SIG1 is in the VDD level and the switching signal MODE2 is in the ground level, the control signal SIG5 of the VDD level is outputted to the transistor N5, as shown in FIG. 10M. Therefore, the transistor N4 is turned on. Thus, the capacitor C3 is remained charged to the voltage VDD.

Subsequently, in the precharging period t13 and the boosting period t14, the same operations in the above-mentioned precharging period t11 and boosting period t12 are repeated.

Figure 11:
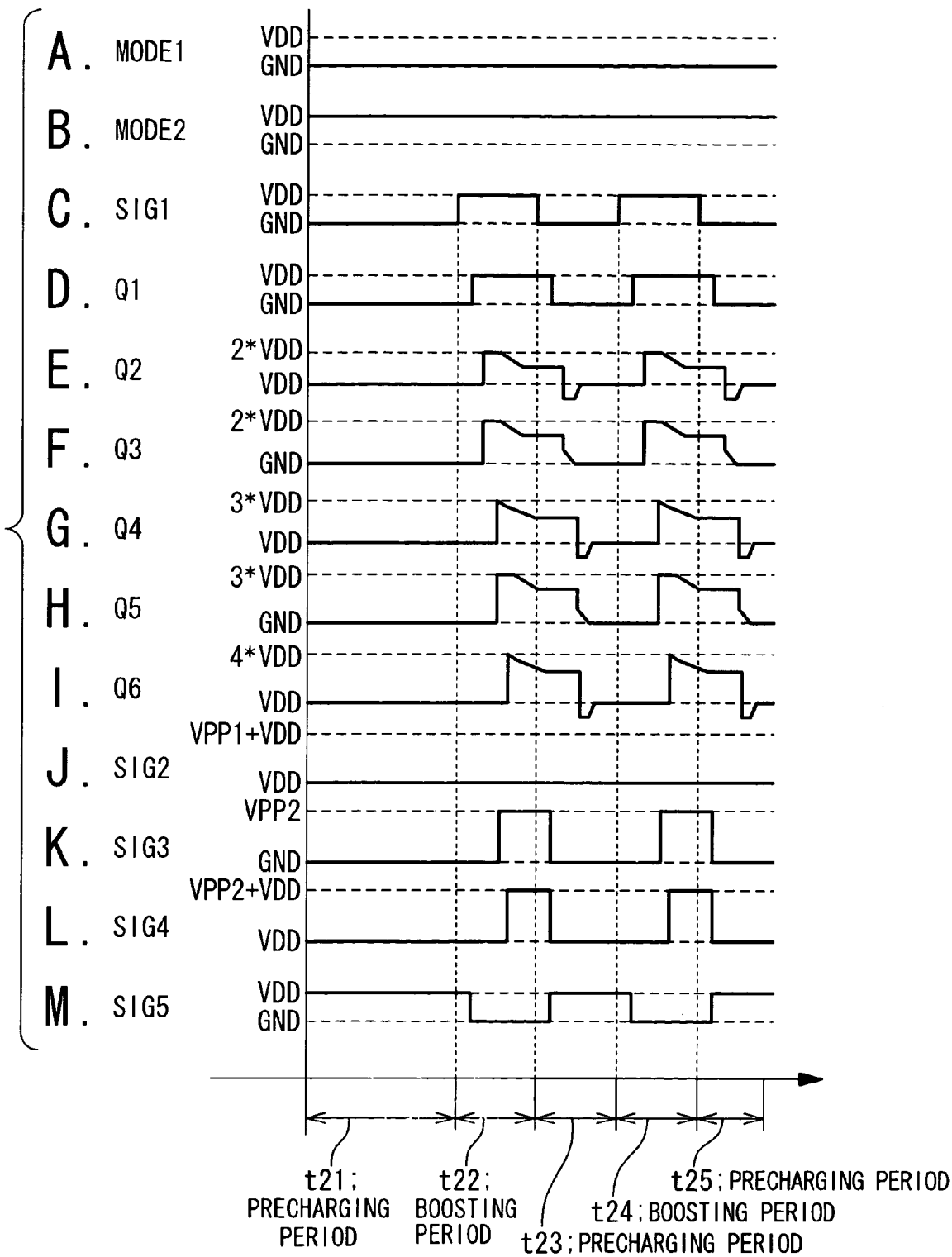
FIGS. 11A to 11M are timing charts showing another operation of the boosting circuit of the present invention in a second mode.

Next, an operation in the second mode will be described. FIGS. 11A to 11M are timing charts showing the operation of the boosting circuit 10 of the present invention in the first mode. In the second mode, the precharging period and the boosting period are alternately carried out. In the second mode, the controller 11 outputs the switch signal MODE1 of the ground level and the switching signal MODE2 of the VDD level to the switching unit 4 in accordance with the command supplied from the external unit, as shown in FIGS. 11A and 11B. Also, the controller 11 outputs the control signal SIG1 of the ground level during the precharging period and the VDD level during the boosting period to the switching unit 4 in accordance with the command supplied from the external unit, as shown in FIG. 11C.

During the precharging period t21, in the first charge pump circuit 1, since the controller 11 outputs the control signal SIG1 of the ground level, the voltage of the node Q1 is set to the ground voltage. As a result, the capacitive section C1 is charged to the voltage VDD through the diode D1. Thus, the voltage of the node Q2 rises to the voltage VDD, as shown in FIGS. 11D and 11E. Similarly, in the first charge pump circuit 1 during the precharging period t21, the output of the inverter P1 and N1 is set to the ground level, and the voltage of the node Q3 is set to the ground voltage. As a result, the capacitive section C2 is charged to the voltage VDD through the diode D2. Thus, the voltage of the node Q4 rises to the voltage VDD, as shown in FIGS. 11F and 11G. In the second switching section 6, since the control signal SIG1 is in the ground level and the switching signal MODE1 is in the ground level, the transistor N6 is turned off and the transistor N7 is turned on. As a result, the capacitor C4 is charged to the voltage VDD through the diode D4 and the control signal SIG2 of the VDD level is outputted to the transistor N2, as shown in FIG. 11J. However, because the node X1 is in a voltage near to the voltage VPP1, the transistor N2 is not turned on. In the third switching section 7, since the control signal SIG1 is in the ground level and the switching signal MODE2 is also in the VDD level, the transistor N8 is turned off and the transistor N9 is turned on. As a result, the control signal SIG3 of the ground level is outputted to the transistor N3, as shown in FIG. 10K. Therefore, the transistor N3 is turned off. In the fourth switching section 8, since the control signal SIG1 is in the ground level and the switching signal MODE2 is in the VDD level, the transistor N10 is turned off and the transistor N11 is turned on. As a result, the control signal SIG4 of the VDD level is outputted to the transistor N4, FIG. 11L. Because the node X1 is in a voltage near to the voltage VPP1, the transistor N2 is not turned on. In the fifth switching section 9, since the control signal SIG1 is in the ground level and the switching signal MODE2 is in the VDD level, the control signal SIG5 of the VDD level is outputted to the transistor N5, as shown in FIG. 11M. Therefore, the transistor N4 is turned on. Thus, the capacitor C3 is charged to the voltage VDD from the voltage VDD through the diode D3.

Subsequently, during the boosting period t22, in the first charge pump circuit 1, since the controller 11 outputs the control signal SIG1 of the VDD level, the voltage of the node Q1 is set to the VDD voltage. As a result, the voltage of the node Q2 rises to the voltage 2VDD, as shown in FIGS. 11D and 11E. Similarly, in the first charge pump circuit 1 during the boosting period t22, the transistor P1 of the inverter P1 and N1 is turned on, and the voltage of the node Q3 is set to equal to the voltage of the node Q2. As a result, the voltage of the node Q4 rises to the voltage 3VDD, as shown in FIGS. 11F and 11G. In the second switching section 6, since the control signal SIG1 is in the VDD level and the switching signal MODE1 is in the ground level, the transistor N6 is turned off and the transistor N7 is turned on. As a result, the transistor P2 is turned on but the transistor P3 is turned off. Thus, the voltage of the drain of the transistor N7 keeps the ground level. Therefore, the control signal SIG2 of the VDD level is outputted to the transistor N2, as shown in FIG. 11J. As a result, the transistor N2 is not turned on. In the third switching section 7, since the control signal SIG1 is in the VDD level and the switching signal MODE2 is in the VDD level, the transistor N8 is turned on and the transistor N9 is turned off. As a result, the control signal SIG3 of the VDD level is outputted to the transistor N3, as shown in FIG. 11K. Therefore, the transistor N3 is turned on. Since the voltage of the node Q4 rises to the voltage 3VDD, the voltage of the node Q6 rises to the voltage 4VDD. In the fourth switching section 8, since the control signal SIG1 is in the VDD level and the switching signal MODE2 is in the VDD level, the transistor N10 is turned on and the transistor N11 is turned off. As a result, the transistor P7 is turned on and the control signal SIG4 of the (VDD+VPP2) level is outputted to the transistor N4, FIG. 11L. Therefore, the transistor N4 is turned on. In the fifth switching section 9, since the control signal SIG1 is in the VDD level and the switching signal MODE2 is in the VDD level, the control signal SIG5 of the ground level is outputted to the transistor N5, as shown in FIG. 11M. Therefore, the transistor N4 is turned off.

Subsequently, in the precharging period t23 and the boosting period t24, the same operations in the above-mentioned precharging period t21 and boosting period t22 are repeated.

As mentioned above, the conventional boosting circuit 100 uses the two charge pump circuits of the first charge pump circuit and the second charge pump circuit, if the third voltage (3*VDD, the output voltage VPP1) is applied to the word line as the internal circuit of the semiconductor device. On the other hand, the conventional boosting circuit 100 uses the three charge pump circuits of the third charge pump circuit, the fourth charge pump circuit and the fifth charge pump circuit 5, if the fourth voltage (4*VDD, the output voltage VPP2) is applied to the capacitive fuse as the internal circuit of the semiconductor device. For this reason, the conventional boosting circuit 100 requires the total of five charge pump circuits. On the contrary, according to the boosting circuit 10 of the present invention, it only requires the total of three charge pump circuits. Thus, the boosting circuit 10 of the present invention only requires the circuit area equal to ⅗ times that of the conventional boosting circuit 100. Therefore, its circuit area is reduced by about 40%. According to the boosting circuit 10 of the present invention, the circuit area can be reduced.

The boosting circuit 10 of the present invention is designed such that the charge pump circuits are connected in the maximum of three stages. However, the number of the stages in which the charge pump circuits are connected in series can be further increased so as to be N-stages (N is the integer of two or more). In this case, the switching unit 4 connects the J (J is the integer satisfying 2☐J☐N) charge pump circuits among the N charge pump circuits in response to the switch signal, and then outputs the voltage equal to (J+1) times the power supply voltage, to the internal circuit 20 of the semiconductor device.

According to the boosting circuit of the present invention, it is possible to generate the voltage higher than the power supply voltage the first voltage for each purpose such as the word line or the capacitive fuse.

Also, according to the boosting circuit of the present invention, it is possible to reduce the circuit area.

What is claimed is:

1. A boosting circuit, comprising:
   a first charge pump circuit which contains a first capacitive section charged to a first voltage;
   a second charge pump circuit which contains a second capacitive section charged to said first voltage;
   a third charge pump circuit which contains a third capacitive section charged to said first voltage; and
   a switching unit which connects said first charge pump circuit, said second charge pump circuit and a first node in series in response to a first switch signal and a control signal such that a second voltage higher than said first voltage is outputted from said first node to a first internal circuit of a semiconductor device, and connects said first charge pump circuit, said second charge pump circuit, said third charge pump circuit and a second node in series in response to a second switch signal and said control signal, such that a third voltage is outputted from said second node to a second internal circuit of said semiconductor device, wherein said switching unit comprises:

a first switching section which connects said first charge pump circuit and said second charge pump circuit in response to said control signal;

a second switching section which connects said second charge pump circuit and said first node in response to said control signal and said first switch signal;

a third switching section which connects said second charge pump circuit and said third charge pump circuit in response to said control signal and said second switch signal; and a fourth switching section which connects said third charge pump circuit and said second node.

2. The boosting circuit according to claim 1, wherein a power supply generates said first voltage, said first charge pump circuit comprises:

said first capacitive section whose first and second side electrodes are connected to said first switching section; and a first backward direction current blocking element whose output is connected to said second side electrode of said first capacitive section and whose input is connected to said power supply, such that a backward current from said first capacitive section to said power supply is blocked, said second charge pump circuit comprises:

said second capacitive section whose first side electrode is connected to said first switching section and whose second side electrode is connected to said second switching section and said third switching section; and a second backward direction current blocking element whose output is connected to said second side electrode of said second capacitive section and whose input is connected to said power supply, such that a backward current from said second capacitive section to said power supply is blocked, and said third charge pump circuit comprises:

said third capacitive section whose first side electrode is connected to said third switching section and whose second side electrode is connected to said fourth switching section; and a third backward direction current blocking element whose output is connected to said second side electrode of said third capacitive section and whose input is connected to said power supply, such that a backward current from said third capacitive section to said power supply is blocked.

3. The boosting circuit according to claim 2, wherein said first switching section comprises:

a first inverting element to which said control signal is inputted;

a second inverting element whose input is connected to an output of said first inverting element and whose output is connected to said first side electrode of said first capacitive section;

a first conductive type of a first transistor which is connected between said second side electrode of said first capacitive section and said first side electrode of said second capacitive section and which receives the output of said first inverting element; and a second conductive type of a second transistor which is connected between said first side electrode of said second capacitive section and a ground potential and which receives the output of said first inverting element.

4. The boosting circuit according to claim 2, wherein said second switching section comprises:

a second switching section control circuit which outputs a second control signal in response to said control signal, said first switch signal and a voltage applied to said first node; and said second conductive type of a third transistor which is connected between said first node and said second side electrode of said second capacitive section.

5. The boosting circuit according to claim 2, wherein said third switching section comprises:

a third switching section control circuit which outputs a third control signal based on said control signal, said second switching signal and a voltage of said second node; and said second conductive type of a fourth transistor which connects said second side electrode of said second capacitive section and said first side electrode of said third capacitive section in response to said third control signal.

6. The boosting circuit according to claim 2, wherein said fourth switching section comprises:

a fourth switching section control circuit which outputs a fourth control signal based on said control signal, said second switching signal and a voltage of said second node; and said second conductive type of a fifth transistor which connects said second side electrode of said third capacitive section and said second node in response to said fourth control signal.

7. The boosting circuit according to claim 2, wherein said switching unit further comprises a fifth switching section which comprises:

a fifth switching section control circuit which outputs a fifth control signal based on said control signal and said second switching signal; and said second conductive type of a sixth transistor which connects said first side electrode of said third capacitive section and said ground potential in response to said fifth control signal.

8. The boosting circuit according to claim 4, wherein said first conductive type is a P-type and said second conductive type is an N-type, said second switcher control circuit comprises:

a first NAND circuit to which said first control signal and said first switch signal are inputted;

a third inverting device whose input is connected to an output of said first NAND circuit;

said second conductive type of a seventh transistor whose gate is connected to an output of said third inverting device and whose source is grounded;

a fourth inverting device whose input is connected to the output of said third inverting device;

said second conductive type of an eighth transistor whose gate is connected to an output of said fourth inverting device and whose source is grounded;

said first conductive type of a ninth transistor whose source is connected to said first node, whose gate is connected to a drain of said eighth transistor and whose drain is connected to a drain of said seventh transistor;

said first conductive type of a tenth transistor whose source is connected to said first node, whose gate is connected to the drain of said seventh transistor and whose drain is connected to the drain of said eighth transistor;
a fourth capacitive section whose negative electrode side is connected to the drain of said eighth transistor and whose positive electrode side is connected to the gate of said third transistor; and
a fourth back flow protecting device whose output is connected to the positive electrode side of said fourth capacitive section and whose input is connected to said power source, for protecting a back flow to said power source from said fourth capacitive section.

9. The boosting circuit according to claim 5, wherein said first conductive type is the P-type and said second conductive type is the N-type, said third switcher control circuit comprises:
a second NAND circuit to which said first control signal and said second switch signal are inputted;
a fifth inverting device whose input is connected to an output of said second NAND circuit;
said second conductive type of an eleventh transistor whose gate is connected to an output of said fifth inverting device and whose source is grounded;
a sixth inverting device whose input is connected to the output of said fifth inverting device;
said second conductive type of a twelfth transistor whose gate is connected to an output of said sixth inverting device, whose drain is connected to the gate of said fourth transistor and whose source is grounded;
said first conductive type of a thirteenth transistor whose source is connected to said second node, whose gate is connected to a drain of said twelfth transistor and whose drain is connected to a drain of said eleventh transistor; and
said first conductive type of a fourteenth transistor whose source is connected to said second node, whose gate is connected to the drain of said eleventh transistor and whose drain is connected to the drain of said twelfth transistor.

10. The boosting circuit according to claim 6, wherein said first conductive type is a P-type and said second conductive type is an N-type, said fourth switcher control circuit comprises:
a third NAND circuit to which said first control signal and said second switch signal are inputted;
a seventh inverting device whose input is connected to an output of said third NAND circuit;
said second conductive type of a fifteenth transistor whose gate is connected to an output of said seventh inverting device and whose source is grounded;
an eighth inverting device whose input is connected to the output of said seventh inverting device;
said second conductive type of a sixteenth transistor whose gate is connected to an output of said eighth inverting device and whose source is grounded;
said first conductive type of a seventeenth transistor whose source is connected to said second node, whose gate is connected to a drain of said sixteenth transistor and whose drain is connected to a drain of said fifteenth transistor;
said first conductive type of an eighteenth transistor whose source is connected to said second node, whose gate is connected to the drain of said fifteenth transistor and whose drain is connected to the drain of said sixteenth transistor;
a fifth capacitive section whose negative electrode side is connected to the drain of said sixteenth transistor and whose positive electrode side is connected to the gate of said third transistor; and
a fifth back flow protecting device whose output is connected to the positive electrode side of said fifth capacitive section and whose input is connected to said power source, for protecting aback flow to said power source from said fifth capacitive section.

11. The boosting circuit according to claim 7, wherein said second conductive type is an N-type,
said fifth switcher control circuit has a fourth NAND circuit to which said first control signal and said second switch signal are inputted and whose output is connected to the gate of said sixth transistor.

12. A semiconductor device, comprising:
a boosting circuit; and
first and second internal circuits connected to said boosting circuit via first and second nodes,
wherein said boosting circuit comprises:
a first charge pump circuit which contains a first capacitive section charged to a first voltage;
a second charge pump circuit which contains a first capacitive section charged to said first voltage;
a third charge pump circuit which contains a first capacitive section charged to said first voltage; and
a switching unit which connects said first charge pump circuit, said second charge pump circuit and said first node in series in response to a first switch signal and a control signal such that a second voltage higher than said first voltage is outputted from said first node to said first internal circuit, and connects said first charge pump circuit, said second charge pump circuit, said third charge pump circuit and the second node in series in response to a second switch signal and said control signal, such that a third voltage is outputted from said second node to said second internal circuit,
wherein said switching unit comprises:
a first switching section which connects said first charge pump circuit and said second charge pump circuit in response to said control signal;
a second switching section which connects said second charge pump circuit and said first node in response to said control signal and said first switch signal;
a third switching section which connects said second charge pump circuit and said third charge pump circuit in response to said control signal and said second switch signal; and
a fourth switching section which connects said third charge pump circuit and said second node.

13. The semiconductor device according to claim 12, wherein a power supply generates said first voltage,
said first charge pump circuit comprises:
said first capacitive section whose first and second side electrodes are connected to said first switching section; and
a first backward direction current blocking element whose output is connected to said second side electrode of said first capacitive section and whose input is connected to said power supply, such that a backward current from said first capacitive section to said power supply is blocked,
said second charge pump circuit comprises:
said second capacitive section whose first side electrode is connected to said first switching section and whose second side electrode is connected to said second switching section and said third switching section; and a second backward direction current blocking element whose output is connected to said second side electrode of said second capacitive section and whose input is connected to said power supply, such that a backward current from said second capacitive section to said power supply is blocked, and said third charge pump circuit comprises:

said third capacitive section whose first side electrode is connected to said third switching section and whose second side electrode is connected to said fourth switching section; and a third backward direction current blocking element whose output is connected to said second side electrode of said third capacitive section and whose input is connected to said power supply, such that a backward current from said third capacitive section to said power supply is blocked.

14. The semiconductor device according to claim 13, wherein said first switching section comprises:

a first inverting element to which said first control signal is inputted;

a second inverting element whose input is connected to an output of said first inverting element and whose output is connected to said first side electrode of said first capacitive section;

a first conductive type of a first transistor which is connected between said second side electrode of said first capacitive section and said first side electrode of said second capacitive section and which receives the output of said first inverting element; and a second conductive type of a second transistor which is connected between said first side electrode of said second capacitive section and a ground potential and which receives the output of said first inverting element.

* * * * *